United States Patent [19]

Tsuzuki et al.

[11] Patent Number: 4,879,254
[45] Date of Patent: Nov. 7, 1989

[54] METHOD OF MANUFACTURING A DMOS

[75] Inventors: Yukio Tsuzuki, Nukata; Masami Yamaoka, Anjo, both of Japan

[73] Assignee: Nippondenso Co., Ltd., Kariya, Japan

[21] Appl. No.: 204,375

[22] Filed: Jun. 9, 1988

[30] Foreign Application Priority Data

Jun. 10, 1987 [JP] Japan .................. 62-144245

[51] Int. Cl.⁴ .......................................... H01L 21/316
[52] U.S. Cl. .......................................... 437/41; 437/44;
437/150; 437/151; 437/203; 437/228; 437/984;
437/947; 148/DIG. 111; 148/DIG. 126;
148/DIG. 131; 148/DIG. 103
[58] Field of Search ............... 437/150, 151, 41, 44,
437/192, 200, 203, 225, 228, 981, 984, 199, 947;
148/DIG. 111, DIG. 126, DIG. 131, DIG. 103

[56] References Cited

U.S. PATENT DOCUMENTS

| | | | |
|---|---|---|---|
| 4,430,792 | 2/1984 | Temple | 437/157 |
| 4,503,598 | 3/1985 | Vora et al. | 437/151 |
| 4,567,641 | 2/1986 | Baliga et al. | 437/141 |
| 4,598,461 | 7/1986 | Love | 437/150 |

FOREIGN PATENT DOCUMENTS 0202477 11/1986 European Pat. Off. .
0080969 5/1984 Japan .
0021571 2/1985 Japan .

OTHER PUBLICATIONS

IEEE Electron Device Letters, vol. EDL-8, No. 4, Apr. 1987, Huang et al., "A New LDD Transistor with Inverse-T Gate Structure", (pp. 151-153).
IEEE Transactions on Electron Devices, vol. ED-31, No. 4, Apr. 1984, Ueda et al., "A New Vertical Double Diffused MOSFET-The Self-Aligned Terraced-Gate MOSFET", (pp. 416-420).

Primary Examiner—Brian E. Hearn
Assistant Examiner—T. N. Quach
Attorney, Agent, or Firm—Cushman, Darby & Cushman

[57] ABSTRACT

A method for manufacturing a DMOS which comprises forming a first conductive type layer on a substrate, forming a gate oxide layer thereon, forming a gate electrode layer and a second insulating layer successively on the gate oxide layer, forming a second conductive type body region and a first conductive type source region having a narrower width by implanting impurities utilizing the second insulating layer as a mask, forming a side wall spacer of an insulating material on at least a side portion of the gate electrode, forming a conductive passage penetrating the source region and extending into the body region while utilizing the second insulating layer and the side wall spacer as mask, optionally implanting the exposed body region, further excessively etching the sidewall spacer, the masking layer overlying the gate, and the gate oxide prior to providing an electrode connecting the source and body regions.

7 Claims, 8 Drawing Sheets

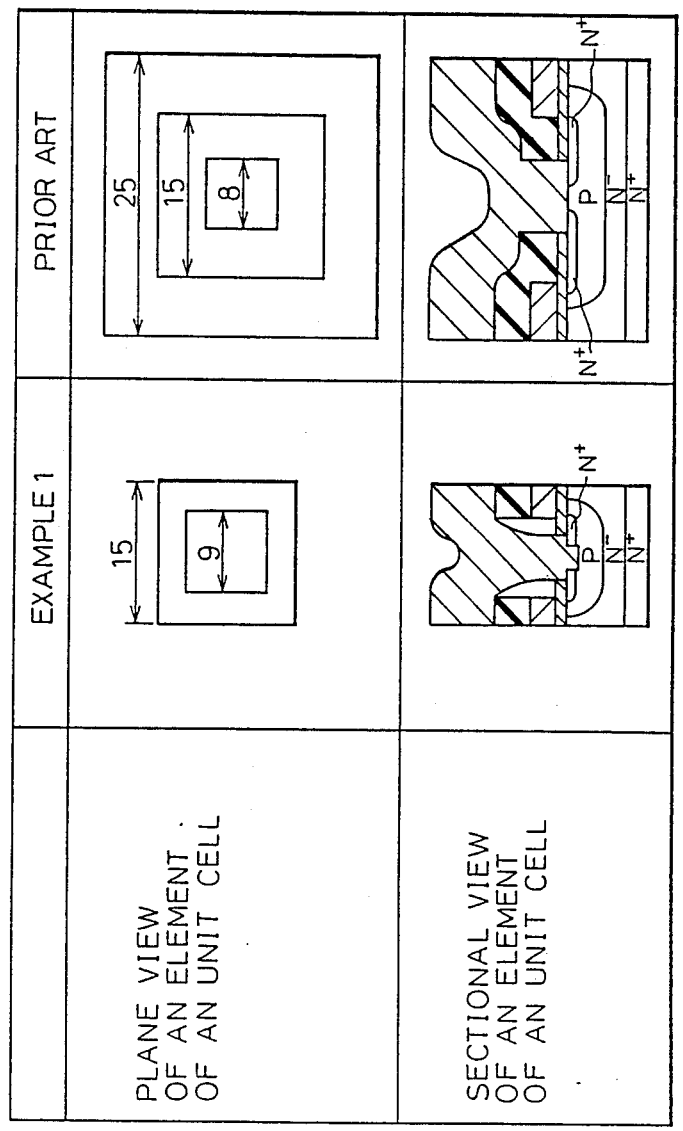

METHOD OF MANUFACTURING A DMOS

BACKGROUND OF THE INVENTION

1. Field of the Invention

This invention is relating to a method for manufacturing a semiconductor device, particularly to a method for manufacturing, for example, a double diffused MOSFET (referred to hereinafter as a DMOS).

2. Description of the Related Art

A vertical type DMOS by which a low ON resistance and high withstanding voltage can be comparatively easily obtained has been generally used as an element in the construction of, for example, a power MOSFET. In this element, a plurality of unit cell transistors each having a size of several tens of μm are connected in parallel to form one element.

Hereafter, a current method for manufacturing the vertical type DMOS is explained with reference to FIG. 2.

First, as shown in FIG. 2, (a), an $N^-$-type epitaxial layer 22 is formed on a main surface of an $N^+$-type Si substrate 21 by an epitaxial growth process and a gate oxide film 23 consisting of $SiO_2$ is fabricated by oxidizing a main surface of the $N^-$-type epitaxial layer 22 with heat. Then, as shown in FIG. 2(b), a polycrystalline silicon layer 24 is deposited on a surface of the gate oxide film 23 by a CVD (Chemical Vapor Deposition) method.

Thereafter, as shown in FIG. 2(c), an opening is provided at a desired region of the polycrystalline silicon layer 24 by an etching method utilizing reactive ions (referred to hereinafter as RIE) and a P-type well region 27 is formed by implanting P-type impurities by ion implantation, using the residual polycrystalline silicon layer 24 as a mask.

A resist 26a is then formed on a desired region in the above opening by a photo etching method, and an $N^+$-type diffusion region 28 is formed in the P-type well region 27 by implanting N-type impurities by ion implantation, using the residual polycrystalline silicon layer 24 and the resist 26a as a mask.

Then, as shown in FIG. 2(d), the resist 26a is removed and an insulating layer 25 consisting of $SiO_2$ is deposited on a whole surface of the device by a CVD method.

Finally, as shown in FIG. 2(e), a resist 26b is formed on a desired region of said insulating layer 25 by photo etching and the insulating layer 25 and the gate oxide film 23 are etched using the resist 26b as a mask, and a line means of, for example, Al (not show), is provided in electrical contact with the P-type well region 27 and N-type diffusion region 28.

The vertical type DMOS thus produced comprises an $N^+$-type Si substrate 21 and an $N^-$-type epitaxial layer 22 as a drain region, an $N^+$-type diffusion region 28 as a source region, a polycrystalline silicon layer 24 as a gate electrode and a P-type well region 27 as a channel region.

When the ON resistance of the power MOSFET is reduced, the current drive performance is increased, and thus the size of the device can be reduced. Accordingly, the ON resistance should be made as low as possible, to meet present requirement for minimizing a chip size and therefore, a number of unit cells provided in the same chip size must be increased, to widen a total channel width thereof by minimizing the size of an element thereof, and thus reduce the size of the unit cell.

Especially, a great effect can be obtained when a withstand voltage of less than 100 V is used, as this enables the extent of a contribution of the channel width to the ON resistance to be improved.

As mentioned above, to make the ON resistance low, preferably the size of the unit cell is reduced.

But, in the current method, in each step, for example, when the $N^+$-type diffusion region 28 is formed inside the P-type well region 27 as explained in FIG. 2(c) and when the opening is formed in the insulating layer 25 and said gate oxide film 23 to provide an electrical connection among the P-type well region 27, N-type diffusion region 28, and wiring means, a photo etching method is applied to the resists 26a and 26b and thus there is a great possibility that deviations between the position of the glass mask and that of the element will occur, and accordingly, marginal portions of about ±3 μm are usually required when designing a unit cell size if a 1:1 projection exposure device is used, and consequently, the minimum size of the unit cell is limited to about 25 to 30 μm.

On the other hand, the unit cell size can be reduced to around 15 to 20 μm by using a reduction projecting exposure device such as a 1:5 Stepper (Direct Stepping on Wafer), but in such a case, a problem arises in that the cost of production of an element will be increased.

SUMMARY OF THE INVENTION

Accordingly, the object of the present invention is to provide a method for manufacturing a semiconductor device having a low ON resistance and enabling a reduction of the size of the unit cell thereof, without receiving any affects from machine performance of an exposure device.

These and other advantages of the present invention will be made apparent by the following explanation, with reference to the accompanying drawings.

BRIEF DESCRIPTION OF THE DRAWINGS

FIG. 3 shows a comparison between the unit cell size of Example 1 of this invention and that of the prior art;

DESCRIPTION OF THE PREFERRED EMBODIMENTS

To attain the object of this invention, a method for manufacturing a semiconductor device basically comprises the steps of forming a first conductive type epitaxial layer having a low impurity concentration on one main surface of a substrate; forming a first insulating layer on one main surface of the epitaxial layer and subsequently forming a gate electrode layer and a second insulating layer successively on a region of the first insulating layer; forming a second conductive type region and a first conductive type region having a width narrower than that of the second conductive type region by doping impurities into the epitaxial layer, while utilizing the second insulating layer as a mask; forming a side wall of an insulating material on at least a side portion of the gate electrode; forming a conductive portion penetrating the first conductive type region and extending into the second conductive type region, while utilizing the second insulating layer and the side wall as mask; forming a first electrode electrically connected to the first conductive type region and the second conductive type region through the conductive portion on a main surface of the epitaxial layer; and finally forming a second electrode on an opposite side of a main surface of said substrate.

According to this invention, a photo etching operation is not required when the first conductive type region is formed inside the second conductive type region and when an electrical connection is formed among the second conductive type region, first conductive type region, and a first electrode, because the conductive portion is formed by a self-alignment process using the second insulating layer and the side wall as a mask, and therefore, a marginal portion for compensating for any positional deviation in the current method is not required, and thus the unit cell size can be reduced to an extent corresponding to the omitted marginal portion. In this invention, the doping method includes a diffusing method and an ion implantation method.

EXAMPLES

Examples of the present invention will be now described with reference to the drawings.

Example 1

FIGS. 1(a) to (j) are sectional views sequentially explaining the configuration of the device in this invention at each process step thereof.

Figure 1A:
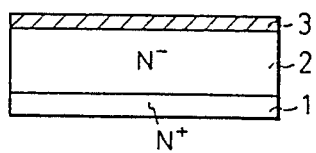
FIGS. 1(a) to (j) are sectional views sequentially explaining the configuration of the device of this invention at each process step thereof.

First, as shown in FIG. 1(a), an N−-type epitaxial layer 2 having a low impurity concentration is formed on a main surface of an N+-type Si substrate 1 by an epitaxial growth process, to form a drain region consisting of the N+-type Si substrate 1 and N−-type epitaxial layer 2.

Then a gate oxide film 3 consisting of $SiO_2$ is formed on a main surface of the N−-type epitaxial layer 2 by oxidizing that surface by a wet HCL method, at a temperature of 875° C. for 60 minutes.

Figure 1B:
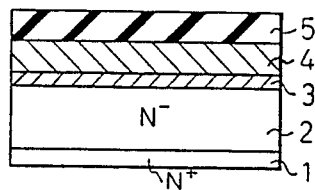

Then, as shown in FIG. 1(b), a polycrystalline silicon layer 4, which is used as a gate electrode, and an insulating layer 5, are successively deposited on a surface of the gate oxide film 3 by a CVD method.

Figure 1C:
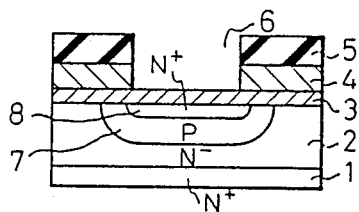

Thereafter, as shown in FIG. 1(c), predetermined portions of the polycrystalline silicon layer 4 and the insulating layer 5 are removed by an RIE method to make an opening 6, a P-type well region 7 is then formed by doping P-type impurities such as B (boron) by ion implantation in a self alignment manner, for example, using the insulating layer 5 as a mask, and then an N+-type diffusion region 8 which is used as a source region, is formed in the P-type well region 7 by doping N-type impurities such as As (arsenic) or P (phosphorous) by ion implantation at a relatively high concentration.

Figure 1D:
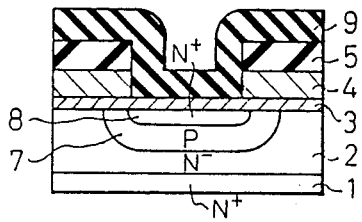

Subsequently, as shown in FIG. 1(d), an insulating layer 9 of $SiO_2$ is deposited on a whole surface of the insulating layer 5 and the gate oxide film 3 by a CVD method. Note, in this example, the TEOS (Tetraethoxysilane) CVD method may be applied at the step shown in FIG. 1(d) of forming the insulating layer 9, since the use of the TEOS CVD method ensures that insulating layer 9 has a uniform film characteristic in which both a vertical and a lateral film thicknesses thereof are equal to each other.

Figure 1E:
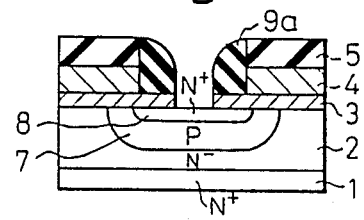

Then as shown in FIG. 1(e), the insulating layer 9 is etched by RIE, until only a side wall 9a remains on a side surface of the polycrystalline silicon layer 4 and the insulating layer 5. This etching operation may be carried out on the gate oxide film 3 at the same time.

Figure 1F:
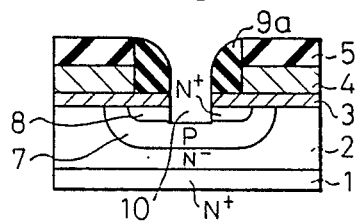

As shown in FIG. 1(f), a concave portion 10 is etched into the N+-type diffusion region 8 and the bottom portion thereof is extended into the P-type well region 7 by an RIE method in the self alignment manner, utilizing the insulating layer 5 and the side wall 9a as a mask. This concave portion is one kind of a conductive portion defined in this invention and the conductive portion further includes a portion consisting of a second conductive type diffusing region or a metallic compound.

Figure 1G:
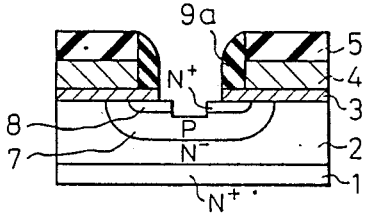

Therefore, as shown in FIG. 1(g), an overetching operation is carried out over the surface of the insulating layer 5, the side wall 9a, and the gate oxide film 3, using ammonium fluoride, to expose a part of a main surface of the N+-type diffusion region 8.

Figure 1H:
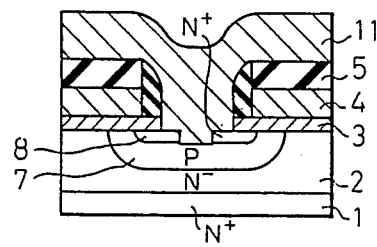
Figure 1I:
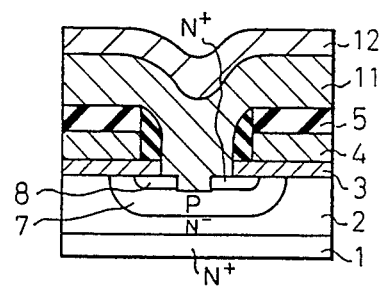

Then, as shown in FIG. 1(h), an aluminum line 11 is formed by a sputtering method, so that the line 11 is connected to both the P-type well region and the N+-type diffusion region 8, and then, as shown in FIG. 1(i), a passivation film 12 of SiN is formed over the aluminum line 11 (Al) wiring by a plasma CVD method.

Figure 1J:
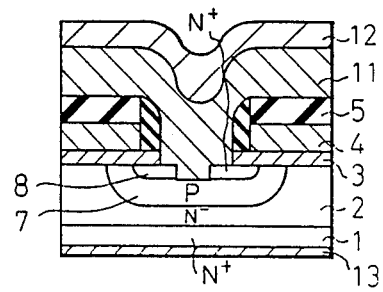
Figure 2A:
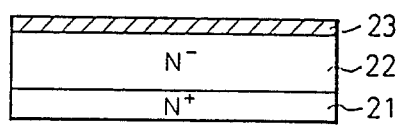
FIGS. 2(a) to (f) are sectional views sequentially explaining the configuration of the device produced by a conventional method at each process step thereof.
Figure 2D:
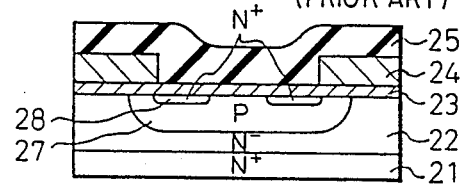
Figure 2B:
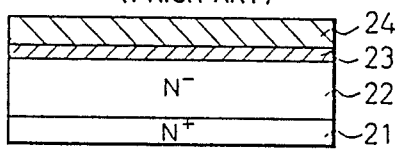
Figure 2E:
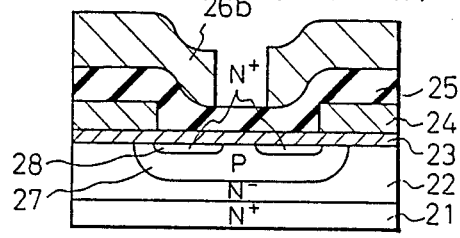
Figure 2C:
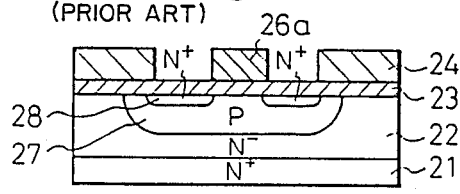
Figure 2F:
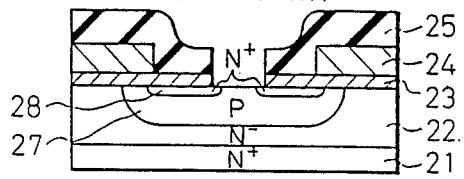

Finally, as shown in FIG. 1(j), thin films of Ti, Ni, and Au, respectively, are formed sequentially on the opposite main surface of the N+-type Si substrate 1 by a sputtering method, to make a drain electrode 13.

According to the present invention, as explained in FIG. 1(c), when forming the N+-type diffusion region 8 in the P-type well region 7, the N+-type diffusion region 8 need not be formed in a shape such as shown in the prior art partition of FIG. 3 plane view but can be formed over a whole area surrounded by the insulating layer 5, and the resists need not be formed by a photo etching method.

Further, as explained in FIG. 1(f), the concave portion 10 is formed by an RIE method in a self alignment manner, using the side wall 9a and the insulating layer 5 as a mask but without using the photo etching method, and the Al line 11 is formed in the concave portion 10 to form a electrical connection between the concave portion 10 and the N+-type diffusion region 8 in the P-type well region 7.

Consequently, in the method of this example, the marginal portion usually required for compensating the positional deviation generally occurring in a conventional type 1:1 projection exposure device during photo etching can be omitted, and accordingly, a reduction of the unit cell size becomes possible.

FIG. 3 shows a comparison of the difference between the current unit cell produced by the conventional method and that of this invention. The Figure shows a plane view of an element of a unit cell in the upper portion thereof, and a cross sectional view of an element of an unit cell in the bottom portion thereof.

As shown in FIG. 3, one side of the conventional unit cell has a length of 25 $\mu$m, reducing the unit area thereof to $25^2$ $\mu m^2$, and one side of the channel width of the conventional unit cell is 15 μm, and thus the channel width thereof per unit cell is 15×4 μm.

Conversely in the unit cell of Example 1 of this invention, the area of the unit cell and the channel width per unit cell thereof are $15^2$ μm and 9×4 μm, respectively.

Accordingly, when calculating the ratio of the channel width to the area in a chip having the same value, the ratio of this invention is 167%, taking the value of the ratio of the conventional unit cell as being 100%, and thus it is clear that the channel width of the present invention has been remarkably extended.

Therefore, the ON resistance of Example 1 will be about 60% when the value of the same resistance of the conventional unit cell is made 100%, and thus a remarkable effect whereby the ON resistance is reduced by about 40% is realized.

According to experiments by the present inventors, it became apparent that As is preferable to P as the impurity used in ion implantation in the step shown in FIG. 1(c) for forming the $N^+$-type diffusion region 8. This was found to be because the diffusion coefficient of As is smaller than that of P, and therefore, when P is used in this step, the depth of the $N^+$-type diffusion region 8 becomes about 0.3 μm, but this depth becomes about 0.1 μm when As is used, and thus the use of As reduces the depth of the concave portion 10.

The Si etching process usually take much time, but this time is shortened by the above process, and thus the roughness of the surface is reduced.

Although the depth of the diffusion region is made shallower when As is used, the contact resistance to the Al electrode 11 is increased. According to the present invention however, this contact resistance is reduced by using the over etching method in the step shown in FIG. 1(g).

Example 2

Next, a second example of the present invention will be explained with reference to the sectional view shown in the FIG. 4.

Figure 4A:
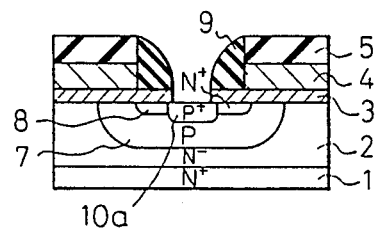
FIGS. 4(a) to (b) are sectional views explaining the process of Example 2 of this invention.
Figure 4B:
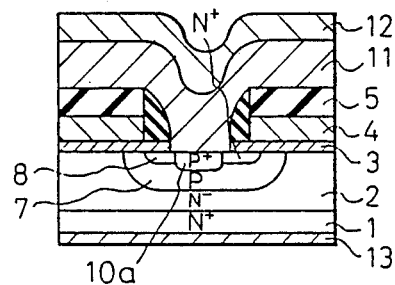

Note, in Example 2, the same steps as shown in FIGS. 1(a) to (e) and FIGS. 1(g) to (j) of Example 1 can be applied, and therefore, the components of FIG. 4 similar to those of FIG. 1 are given the same reference numbers as in FIG. 1, and an explanation thereof omitted. Further, FIG. 4(a) corresponds to FIG. 1(f) and FIG. 4(b) is a sectional view of the final product of Example 2 corresponding to FIG. 1(j).

The difference between Example 2 and Example 1 is that, as shown in the FIG. 4(a), a $P^+$-type diffusion region 10a is formed by implanting P-type impurities by ion implantation at a high concentration in a self alignment manner, utilizing the side wall 9a and the insulating layer 5 as a mask, and the electrical connection between the Al line 11 and the P-type well region 7 is formed through the $P^+$-type diffusion region 10a. This $P^+$-type diffusion region 10a is an another kind of a conductive portion of this invention.

In Example the step of forming the $P^+$-type diffusion region 10a may be carried out before etching the gate oxide film 3.

Example 3

Next, a third example of the present invention will be explained with reference to the sectional view shown in the FIG. 5.

Figure 5A:
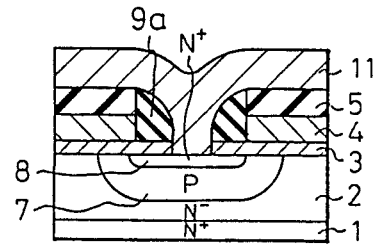
FIGS. 5(a) to (c) are sectional views explaining the process of Example 3 of this invention.
Figure 5B:
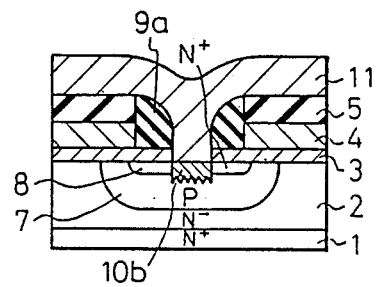

Note, in Example 3, the same steps as shown in FIGS. 1(a) to (e) of Example 1 can be applied, and therefore, the components of FIG. 5 similar to those of FIG. 1 are given the same reference numbers as in FIG. 1, and an explanation thereof omitted.

Figure 5C:
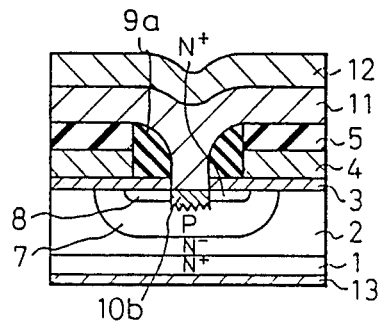

In Example 3 the step shown in FIG. 1(e) is followed by the step of depositing the Al wiring 11 by a sputtering method to form an electrical connection with the $N^+$-type diffusion region 8, as shown in FIG. 5(a), the step of forming a compound of Al and/or Si by sintering the portion under a forming gas atmosphere at a temperature of abut 400° to 500° C., which conditions are very severe compared with the normal conditions, to form an Al silicide region 10b, the bottom of which reaches the P-type well region 7, as shown in FIG. 5 (b), and the step of forming a passivation film 12 and a drain electrode 13 by the same method as in Example 1 as shown in FIG. 5(c).

In Example 3, when the sintering operation is carried out, the Al silicide region 10b can be selectively formed inside the region surrounded by the side wall 9a, since the side wall 9a and the insulating layer 5 act as masks, and further, the electrical connection between the Al line 11, the P-type well region 7, and the $N^+$-type diffusion region 8 is formed through the Al silicide region 10b, and thus Example 3 realizes the same effect as obtained in Examples 1 and 2.

Further, in Example 3, neither etching nor ion implantation are used to form the Al silicide region 10b, but instead the conditions therefor are previously delineated, and thus the manufacturing process can be simplified.

Although in Examples 1 and 2, it is immaterial whether the material used for the Al for the line includes Si or the like, in Example 3, preferably a pure Al, without the inclusion of Si or the like, is used.

Moreover, before forming the Al line 11, when the Al silicide region 10b is reduced to a solid epitaxial region which is grown with amorphous Si contained in the Al-Si by implanting $Si^+$ ions by ion implanting, a stable contact region having a lower ohmic resistance than that of usual Al—Ai, and preventing any diffusion of Al into Si, can be obtained. The Al silicide, a metallic compound is an another kind of conductive portion of this invention.

Example 4

Next, a fourth example of the present invention will be explained with reference to the sectional view shown in the FIG. 6.

Note, in Example 4, the same steps as shown in FIGS. 1(a) to (e) of Example 1 can be be applied and therefore the components of FIG. 6 similar to those of FIG. 1 are given the same reference numbers as in FIG. 1, and an explanation thereof omitted.

Figure 6A:
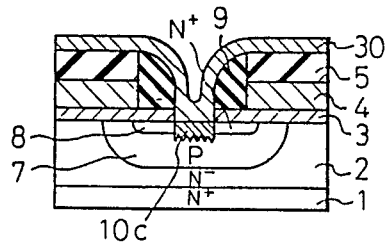
FIGS. 6(a) to (c) are sectional views explaining the process of Example 4 of this invention; and, FIGS. 7(a) to (e) are sectional views explaining the process of Example 5 of this invention.
Figure 6B:
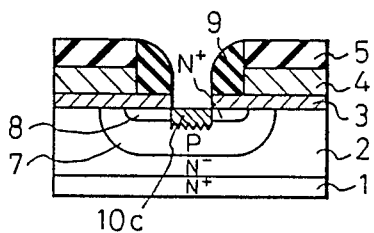
Figure 6C:
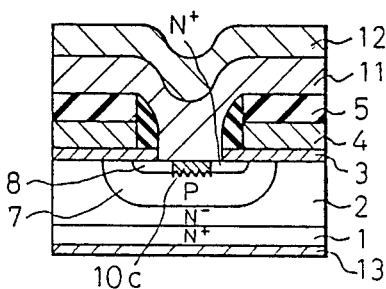

In Example 4, the step shown in FIG. 1(e) is followed by the step of depositing a metallic film 30 made of Ti, Wo, Mo, or the like by a sputtering method or an evaporation method, form an electrical connection with the $N^+$-type diffusion region 8, as shown in FIG. 6(a), the step of forming a metal silicide region 10c, which is a compound of metal and Si, only in a region surrounded by the side wall 9a by the sintering operation used in Example 3, a step of removing the metallic film 30 by etching with $H_2SO_4$, $HNO_3$ or the like, as shown in FIG. 6(b), and a step of forming an Al wiring 11, a passivation film 12, and a drain electrode 13 by the same method as in Example 1, as shown in FIG. 6(c) after the etching of the side wall 9a is carried out in the same manner as described in Example 1.

According to Example 4, as Example 3, an electrical connection between the Al line 11 and the P-type well region 7 through the metal silicide region 10c can be obtained, and thus the same effect realized in the previous Examples is obtained.

In Example 4, the control of the metal silicide region 10c can be increased by selecting a metallic material having a lower reactivity to Si than to Al as the material of the metallic film 30. The metal silicide region 10c is also another kind of conductive portion of this invention.

Example 5

Next, a fifth example of the present invention will be explained with reference to the sectional view shown in the FIG. 7.

Note, in Example 5, the same steps as shown in FIGS. 1(a) to (f) of Example 1 can be applied, and therefore, the components of FIG. 7 similar to those of FIG. 1 are given the same references numbers as in FIG. 1, and an explanation thereof omitted.

Figure 7A:
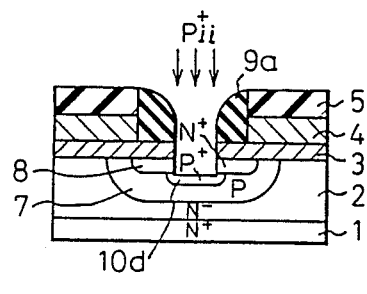
Figure 7B:
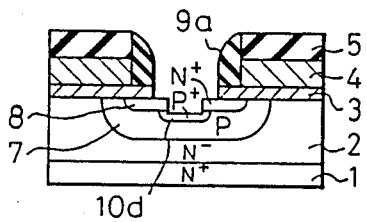
Figure 7C:
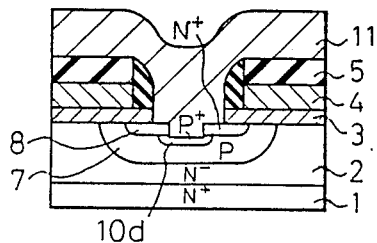
Figure 7D:
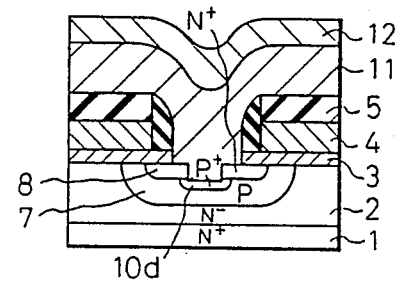
Figure 7E:
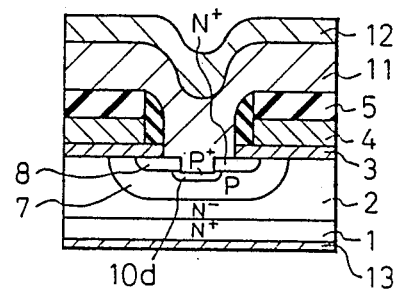

Further note, FIG. 7(a) shows a characteristic feature of Example 5 and FIGS. 7(b) to (l) corresponding to the FIGS. 1 (g) to (j), respectively.

In Example 5, after the step shown in FIG. 1(f), separate ion implanting operation is added as shown in FIG. 7(a).

Namely, after the concave portion 10 is formed by an RIE method in a self alignment manner utilizing the insulating layer 5 and the side wall 9a as a mask, as show in FIG. 1(f), in Example 5, a further ion implanting operation is carried out to implant the P-type impurities such as B (boron), GA (gallium), or In (indium) in a self alignment manner, using the insulating layer 5 and the side wall 9a as a mask, to form a P+-region 10d in the P-type well region 7 as shown in FIG. 7(a).

In Example 5, the steps following the step mentioned above are the same as that of Example 1, with the exception of the adding of the P+-region 10d in FIGS. 7(b) to (e).

In Example 5, the contact between the P-type well region 7 and the Al line 11 is remarkably improved.

The present invention has been described with reference to 5 examples, but this invention is not restricted to these Examples and various modifications thereof are possible within the scope of the concept of this invention. For example, in the Examples above an N-type DMOS is used but obviously a P-type DMOS also can be used in this invention.

Further the same effect can be obtained even when the type of the substrate of the semiconductor is reversed, to make a MOSFET having a modulation conductivity, and further, in the Example 5 mentioned above, a device having a two layer construction comprising an N+-type Si substrate 1 and an N--type epitaxial layer 2 is used, but a device having three layers or more may be used in this invention.

EFFECT OF THE INVENTION

As described above, according to this invention, photo etching is not required when forming the first conductive type region inside the second coductive type region and when forming an electrical connection among the second conductive type region, the first conductive type region, and a first electrode, since a conductive portion is formed by self alignment using the second insulating layer and the side wall as a mask, and therefore, the margin required for compensating positional deviation in the conventional method can be omitted, and thus the unit cell size can be reduced to an extent corresponding to the omitted margin.

Also a superior effect is realized in that the number of unit cell transistors fabricated in the same chip can be increased and the total channel width is also extended, and thus a semiconductor device having a low ON resistance can be produced.

We claim:

1. A method of manufacturing a semiconductor device, which comprises the steps of:
    forming a first conductivity-type layer, having a low impurity atom concentration, on one main surface of a substrate;
    forming a first insulating layer on one main surface of said first conductivity-type layer followed by forming a gate electrode layer and a second insulating layer successively on a region of said first insulating layer;
    forming, in said first conductivity-type layer, both a second conductivity-type region and a first conductivity-type region having a narrower width than that of said second conductivity-type region by doping impurities into said first conductivity-type layer utilizing said second insulating layer as a mask:
    forming a side wall of an insulating material on at least a side portion of said gate electrode layer;
    forming a conductive portion penetrating through said first conductivity-type region and extending into said second-conductivity-type region utilizing said second insulating layer and said insulating material on said side wall as a mask;
    excessively etching said insulating material on said side wall, said first insulating layer, and said second insulating layer to widen an area defined by said side wall;
    forming a first electrode electrically connected to said first conductivity-type region and said second-conductivity-type region through said conductive portion on a main surface of said first conductivity-type layer; and
    forming a second electrode on an opposite side of a main surface of said substrate.

2. A method of manufacturing a semiconductor device according to claim 1, wherein said forming a conductive portion step includes the steps of forming a metallic compound by first forming a metallic layer on a surface of said first conductivity-type region while utilizing said second insulating layer and said side wall as a mask, and then heating said metallic layer to reduce same to said metallic compound in a region of said first conductivity type region, and the top end portion thereof to reach said second conductivity-type region through said first conductivity-type region.

3. A method of manufacturing a semiconductor device according to claim 1, wherein said first insulating layer is an N+ type diffusion region containing As therein as the impurity.

4. A method of manufacturing a semiconductor device according to claim 1, wherein said insulating material for forming at least said side wall is Tetraethoxysilane (TEOS) and said insulating layer is formed by a TEOS CVD method.

5. A method for manufacturing a semiconductor device according to claim 1, wherein said conductive portion is a concave portion formed by an etching method while utilizing said second insulating layer and said side wall as a mask.

6. A method for manufacturing a semiconductor device according to claim 1, wherein said conductive portion consists of a second conductivity type diffusing region formed by an ion implantation method while utilizing said second insulating layer and said side wall as a mask.

7. A method for manufacturing a semiconductor device according to claim 2, wherein a metallic substance of said metallic layer is the same material as that of the first electrode.

* * * * *